(12) United States Patent
Kim et al.

(10) Patent No.: US 9,504,124 B2
(45) Date of Patent: Nov. 22, 2016

(54) NARROW BORDER DISPLAYS FOR ELECTRONIC DEVICES

(71) Applicant: Apple Inc., Cupertino, CA (US)

(72) Inventors: Sang Ha Kim, Dublin, CA (US); Silvio Grespan, Shanghai (CN); John Z. Zhong, Cupertino, CA (US); Jean-Pierre Guillou, San Francisco, CA (US); Kuo-Hua Sung, Sunnyvale, CA (US); Paul S. Drzaic, Morgan Hill, CA (US); Young Bae Park, San Jose, CA (US); Vasudha Gupta, Cupertino, CA (US)

(73) Assignee: Apple Inc., Cupertino, CA (US)

( * ) Notice: Subject to any disclaimer, the term of this patent is extended or adjusted under 35 U.S.C. 154(b) by 301 days.

(21) Appl. No.: 13/945,782

(22) Filed: Jul. 18, 2013

(65) Prior Publication Data

US 2014/0184057 A1    Jul. 3, 2014

Related U.S. Application Data

(60) Provisional application No. 61/748,705, filed on Jan. 3, 2013.

(51) Int. Cl.
| | | |
|---|---|---|
| *H05B 33/14* | (2006.01) | |
| *G06F 1/16* | (2006.01) | |
| *H04M 1/02* | (2006.01) | |
| *H05K 1/18* | (2006.01) | |
| *H01L 51/50* | (2006.01) | |

(52) U.S. Cl.
CPC ........... *H05B 33/145* (2013.01); *G06F 1/1626* (2013.01); *G06F 1/1637* (2013.01); *H04M 1/0266* (2013.01); *H05K 1/189* (2013.01); *H01L 51/50* (2013.01); *H05K 2201/10128* (2013.01)

(58) Field of Classification Search
CPC .... H05B 33/145; G06F 1/1637; H01L 51/50
See application file for complete search history.

(56) References Cited

U.S. PATENT DOCUMENTS

| | | | |
|---|---|---|---|
| 4,507,170 A | 3/1985 | Myhre | |
| 5,694,190 A | 12/1997 | Matsumoto et al. | |
| 5,717,556 A | 2/1998 | Yanagida | |
| 5,777,855 A | 7/1998 | Yokajty | |
| 6,104,464 A | 8/2000 | Adachi et al. | |
| 6,201,346 B1 * | 3/2001 | Kusaka | 313/504 |
| 6,483,714 B1 * | 11/2002 | Kabumoto | H01L 23/49822 174/250 |
| 6,498,592 B1 | 12/2002 | Matthies | |
| 6,633,134 B1 * | 10/2003 | Kondo et al. | 315/169.3 |
| 6,717,057 B1 | 4/2004 | Segall et al. | |

(Continued)

FOREIGN PATENT DOCUMENTS

| | | |
|---|---|---|
| CN | 102568377 | 7/2012 |
| EP | 1533852 | 5/2005 |

(Continued)

*Primary Examiner* — Elmito Breval
(74) *Attorney, Agent, or Firm* — Treyz Law Group, P.C.; Kendall P. Woodruff

(57) ABSTRACT

An electronic device may be provided with an organic light-emitting diode display with minimized border regions. The border regions may be minimized by providing conductive structures that pass through polymer layers of the display and/or conductive structures that wrap around an edge of the display and couple conductive traces on the display to conductive traces on additional circuitry that is mounted behind the display.

20 Claims, 11 Drawing Sheets

(56) References Cited

U.S. PATENT DOCUMENTS

| | | |
|---|---|---|
| 7,816,856 B2 | 10/2010 | Cok et al. |
| 8,106,309 B2 | 1/2012 | Hwang |
| 8,319,725 B2 | 11/2012 | Okamoto et al. |
| 8,434,909 B2 | 5/2013 | Nichol et al. |
| 8,492,969 B2 | 7/2013 | Lee et al. |
| 2002/0097352 A1* | 7/2002 | Houdeau .................. 349/58 |
| 2005/0078099 A1 | 4/2005 | Amundson et al. |
| 2005/0212419 A1 | 9/2005 | Vazan et al. |
| 2006/0231844 A1* | 10/2006 | Carter ........................ 257/79 |
| 2008/0024060 A1* | 1/2008 | Jonnalagadda et al. ...... 313/509 |
| 2008/0241549 A1 | 10/2008 | Seon et al. |
| 2008/0248191 A1 | 10/2008 | Daniels |
| 2009/0021666 A1 | 1/2009 | Chen |
| 2009/0148678 A1 | 6/2009 | Hwang |
| 2009/0189835 A1 | 7/2009 | Kim et al. |
| 2009/0322214 A1* | 12/2009 | Lee .................. H05B 33/04 313/504 |
| 2010/0148654 A1 | 6/2010 | Yan et al. |
| 2010/0308335 A1 | 12/2010 | Kim |
| 2010/0308355 A1 | 12/2010 | Hsieh et al. |
| 2011/0007042 A1 | 1/2011 | Miyaguchi |
| 2011/0241563 A1 | 10/2011 | Kim et al. |
| 2012/0146886 A1 | 6/2012 | Minami et al. |
| 2012/0208306 A1 | 8/2012 | Haas et al. |
| 2012/0307423 A1 | 12/2012 | Bohn et al. |
| 2013/0026505 A1 | 1/2013 | Lee et al. |
| 2013/0081756 A1 | 4/2013 | Franklin et al. |
| 2013/0112984 A1 | 5/2013 | Kim et al. |
| 2013/0180882 A1 | 7/2013 | Hamers et al. |
| 2014/0042406 A1 | 2/2014 | Degner et al. |
| 2014/0092338 A1 | 4/2014 | Miyazaki |
| 2014/0184057 A1 | 7/2014 | Kim et al. |
| 2014/0240985 A1 | 8/2014 | Kim et al. |
| 2014/0299884 A1 | 10/2014 | Park et al. |

FOREIGN PATENT DOCUMENTS

| | | |
|---|---|---|
| JP | H05-177043 | 7/1993 |
| JP | H11-126691 | 5/1999 |
| JP | H11-219782 | 8/1999 |
| JP | 2001092381 | 4/2001 |
| JP | 2007248689 | 9/2007 |
| JP | 2008033095 | 2/2008 |
| JP | 2008071523 | 3/2008 |
| JP | 2009094099 | 4/2009 |
| JP | 2012118341 | 6/2012 |
| JP | 2012128006 | 7/2012 |
| JP | 2012220635 | 11/2012 |
| TW | 548185 | 8/2003 |
| TW | 201002125 | 1/2010 |
| TW | 201044899 | 12/2010 |
| TW | M429927 | 5/2012 |
| TW | 201229179 | 7/2012 |
| WO | 0027172 A1 | 5/2000 |
| WO | 01/08128 | 2/2001 |
| WO | 2008001051 | 1/2008 |
| WO | 2009/019865 | 2/2009 |
| WO | 2012078040 | 6/2012 |

* cited by examiner

NARROW BORDER DISPLAYS FOR ELECTRONIC DEVICES

This application claims the benefit of provisional patent application No. 61/748,705, filed Jan. 3, 2013, which is hereby incorporated by reference herein in its entirety.

BACKGROUND

This relates generally to electronic devices, and more particularly, to electronic devices with displays.

Electronic devices often include displays. For example, cellular telephones and portable computers often include displays for presenting information to a user. An electronic device may have a housing such as a housing formed from plastic or metal. Components for the electronic device such as display components may be mounted in the housing.

It can be challenging to incorporate a display into the housing of an electronic device. Size and weight are often important considerations in designing electronic devices. If care is not taken, displays may be bulky or may be surrounded by overly large borders. The housing of an electronic device can be adjusted to accommodate a bulky display with large borders, but this can lead to undesirable enlargement of the size and weight of the housing and unappealing device aesthetics.

It would therefore be desirable to be able to provide improved displays for electronic devices.

SUMMARY

An electronic device may be provided with a display such as an organic light-emitting diode display. The display may include organic light-emitting diode structures that include a layer of organic light-emitting material that is interposed between an encapsulation layer and a polymer layer having an array of thin-film transistors. The organic light-emitting diode structures may include a support layer such as a backfilm layer formed from a second polymer material and attached to the polymer layer.

The display may include other layers such as a transparent cover layer and a layer of touch-sensitive electrodes. The touch-sensitive electrodes may be formed from transparent conductive material such as indium tin oxide and may be formed on an interior surface of the transparent cover layer or may be formed on a separate touch sensor substrate.

The organic light-emitting diode structures may include a planar central portion that is attached to the touch-sensitive components on the cover layer.

The organic light-emitting diode structures may include conductive structures that pass through a portion of the organic light-emitting diode structures or that extend along an edge of the organic light-emitting diode structures and that connect the organic light-emitting diode structures to the additional circuitry. In this way, inactive border regions of the display for accommodating display circuitry such as display signal lines may be reduced without bending the edges of the organic light-emitting diode structures.

The additional circuitry may include one or more flexible printed circuits, one or more integrated circuits or other circuitry for generating and transmitting control signals for operating the organic light-emitting diode display.

Further features of the invention, its nature and various advantages will be more apparent from the accompanying drawings and the following detailed description of the preferred embodiments.

DETAILED DESCRIPTION

Electronic devices may include displays. The displays may be used to display images to a user. Illustrative electronic devices that may be provided with displays are shown in FIGS. 1, 2, and 3.

Figure 1:
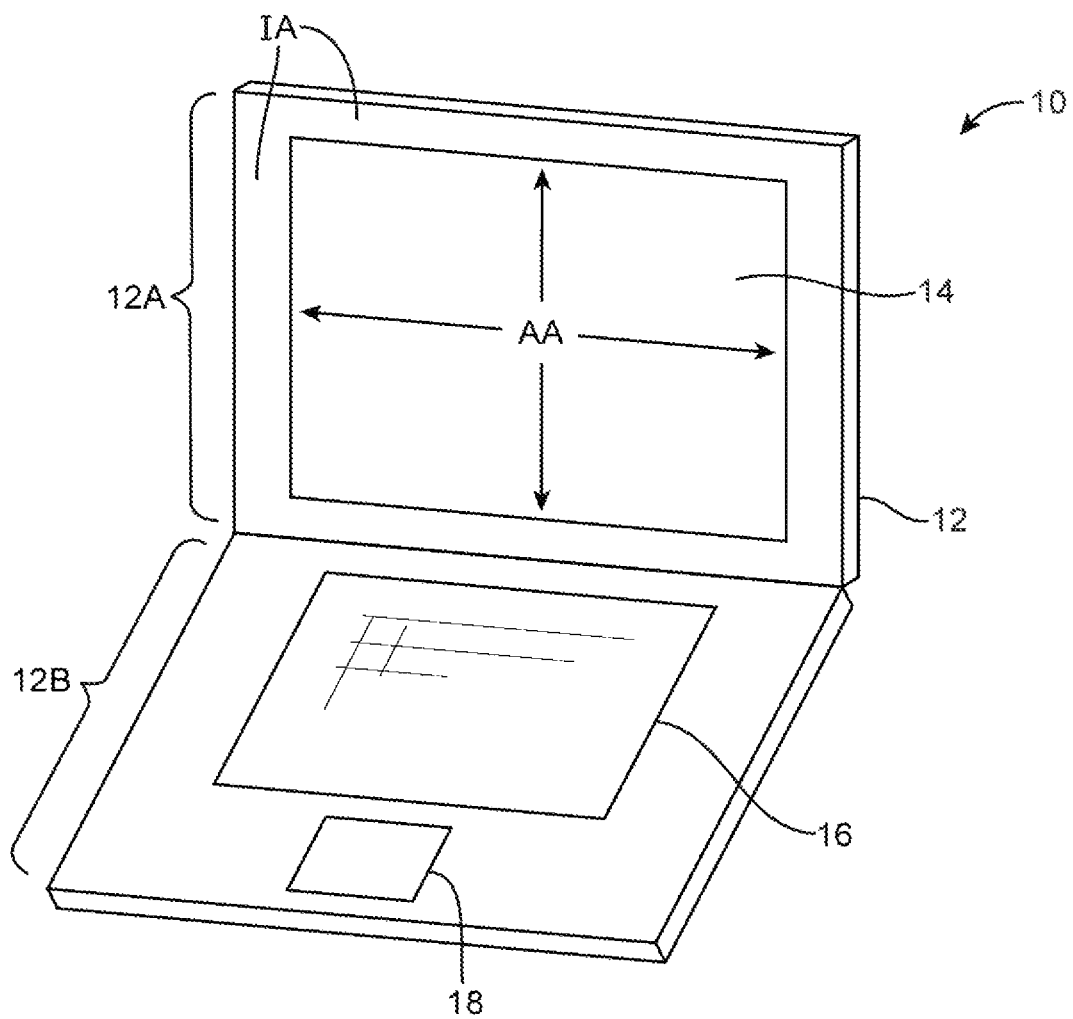
FIG. 1 is a perspective view of an illustrative electronic device such as a laptop computer with a display in accordance with an embodiment of the present invention.
Figure 2:
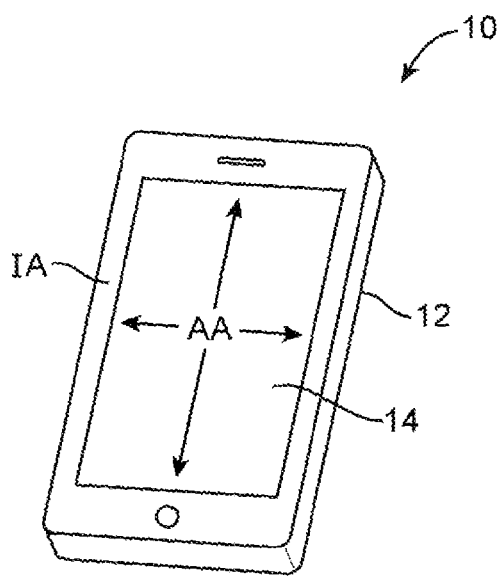
FIG. 2 is a perspective view of an illustrative electronic device such as a handheld electronic device with a display in accordance with an embodiment of the present invention.
Figure 3:
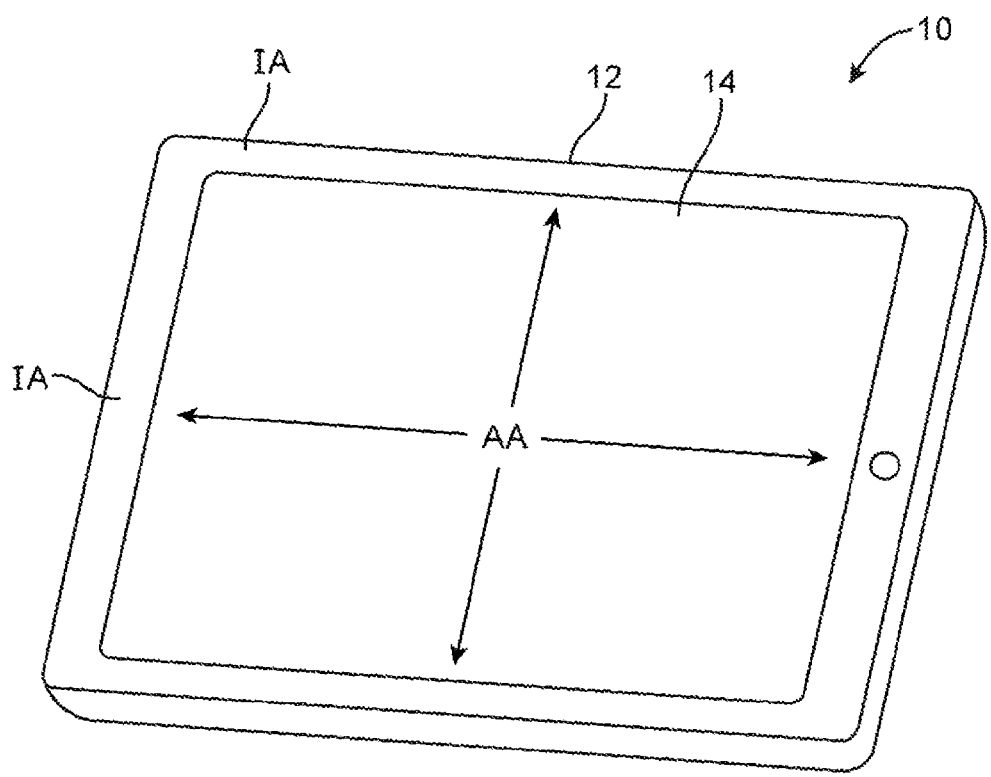
FIG. 3 is a perspective view of an illustrative electronic device such as a tablet computer with a display in accordance with an embodiment of the present invention.

Illustrative electronic devices that may be provided with displays are shown in FIGS. 1, 2, and 3. FIG. 1 shows how electronic device 10 may have the shape of a laptop computer having upper housing 12A and lower housing 12B with components such as keyboard 16 and touchpad 18. FIG. 2 shows how electronic device 10 may be a handheld device such as a cellular telephone, music player, gaming device, navigation unit, or other compact device. FIG. 3 shows how electronic device 10 may be a tablet computer. These are merely illustrative examples. Electronic devices such as illustrative electronic device 10 of FIGS. 1, 2, and 3 may be laptop computers, computer monitors with embedded computers, tablet computers, cellular telephones, media players, other handheld and portable electronic devices, smaller devices such as wrist-watch devices, pendant devices, headphone and earpiece devices, other wearable and miniature devices, or other electronic equipment.

Device 10 may have a housing such as housing 12. Housing 12, which is sometimes referred to as a case, may be formed of materials such as plastic, glass, ceramics, carbon-fiber composites and other composites, metal, other materials, or a combination of these materials. Device 10 may be formed using a unibody construction in which most or all of housing 12 is formed from a single structural element (e.g., a piece of machined metal or a piece of molded plastic) or may be formed from multiple housing structures (e.g., outer housing structures that have been mounted to internal frame elements or other internal housing structures).

Device 10 may have one or more displays such as display 14. Display 14 may be an organic light-emitting diode (OLED) display or other suitable display. Display 14 may, if desired, include capacitive touch sensor electrodes for a capacitive touch sensor array or other touch sensor structures (i.e., display 14 may be a touch screen). Touch sensor electrodes may be provided on a touch panel layer that is interposed between organic light-emitting diode display structures and a transparent cover layer (e.g., a cover glass layer), may be formed on the underside of a cover layer, or may otherwise be incorporated into display 14.

As shown in FIGS. 1, 2, and 3, display 14 may be characterized by a central active region such as active region AA in which an array of display pixels is used in displaying information for a user. Active region AA may be surrounded by an inactive region such as inactive border region IA. Active region AA may have a rectangular shape. Inactive region IA may have a rectangular ring shape that surrounds active region AA (as an example). Portions of display 14 in inactive region IA may be covered with an opaque masking material such as a layer of black ink (e.g., a polymer filled with carbon black) or a layer of opaque metal. The opaque masking layer may help hide components in the interior of device 10 in inactive region IA from view by a user.

The organic light-emitting diode display structures (sometimes referred to as the OLED display structures, the OLED structures, the organic light-emitting diode structures, the organic light-emitting diode layer, the light-generating layers, the image-generating layers, the display layer, or the image pixel layer) may have a planar rectangular active region in its center that forms active area AA of display 14. The rectangular active region includes an array of light-emitting diode pixels. The edges of the organic light-emitting diode layer surround the active center region and form a rectangular peripheral ring. This border region contains circuitry such as signal lines and display driver circuitry that does not emit light and is therefore referred to as the inactive portion of the display. The inactive portion of the display is shown as inactive border region IA in FIGS. 1, 2, and 3.

To enhance device aesthetics, the width of inactive area IA that is visible from the front of the display may be minimized. Inactive area IA may be minimized by providing display 14 with conductive structures that pass through a portion of one or more polymer layers of the display (e.g., microvias or conductive-material-filled notches) and/or conductive structures formed along an edge of one or more polymer layers (e.g., wire bonds, wedge bonds, jet pasted solder, heat seal structures) that couple conductive traces on a front side of organic light-emitting diode structures to conductive traces on a flexible printed circuit located behind the display.

When this type of arrangement is used, the width of inactive border regions IA of devices 10 of FIGS. 1, 2, and 3 that is visible from the front of display 14 is minimized without bending the organic light-emitting diode structures.

The minimal edge portion of display 14 that remains visible may be covered with a bezel or a portion of a display cover layer that is coated on its underside with an opaque masking layer such as black ink (as examples). A bezel may be formed, for example, from a stand-alone bezel structure that is mounted to housing 12, from a portion of housing 12 (e.g., a portion of the sidewalls of housing 12), or using other suitable structures.

Figure 4:
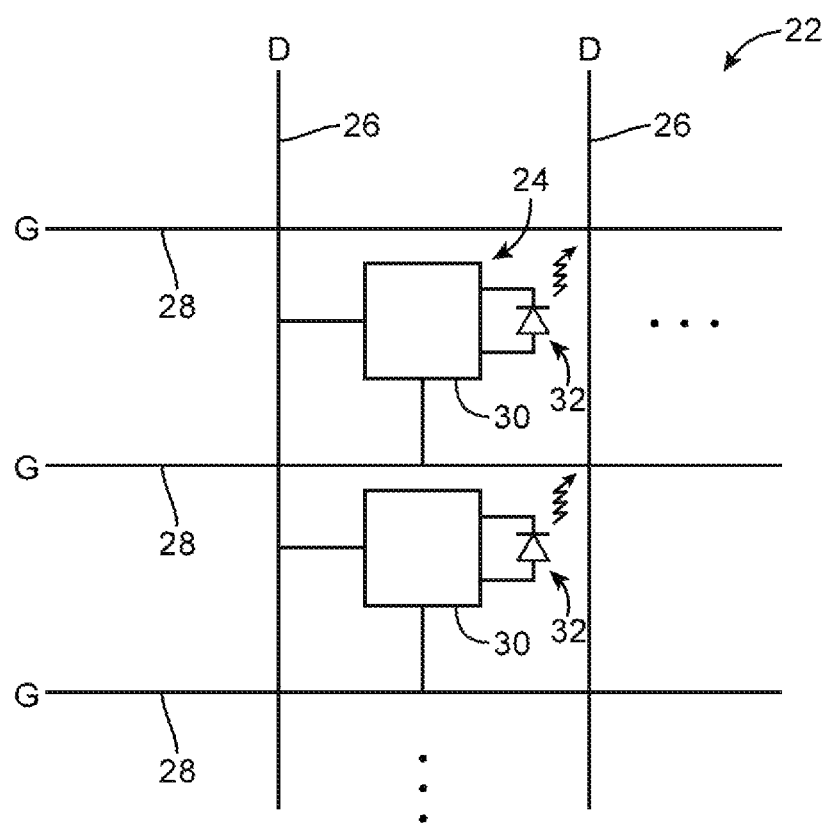
FIG. 4 is a circuit diagram of a portion of a pixel array on a display in accordance with an embodiment of the present invention.

A portion of the active region in display 14 is shown in FIG. 4. As shown in FIG. 4, the active region may include an array of light-emitting display pixels 24 such as array 22. Pixels 24 may be arranged in rows and columns in array 22 and may be controlled using a pattern of orthogonal control lines. The control lines in pixel array 22 may include gate lines 28 and data lines 26. There may be, for example, a pair of gate lines 28 interposed between each row of pixels 24 and a data line interposed between each column of image pixels.

Each pixel may include a light-emitting element such as organic light-emitting diode 32 and associated control circuitry 30. Control circuitry 30 may be coupled to the data lines and gate lines so that control signals may be received from driver circuitry. The driver circuitry may include on-display driver circuits such as gate line drivers implemented using low-temperature polysilicon transistors formed in the inactive portion of the display. The driver circuitry may also include a driver integrated circuit (e.g., a driver integrated circuit mounted in the inactive region or a driver integrated circuit mounted on an external printed circuit and coupled to pads in the inactive region using a cable such as a cable based on a flex circuit).

Figure 5:
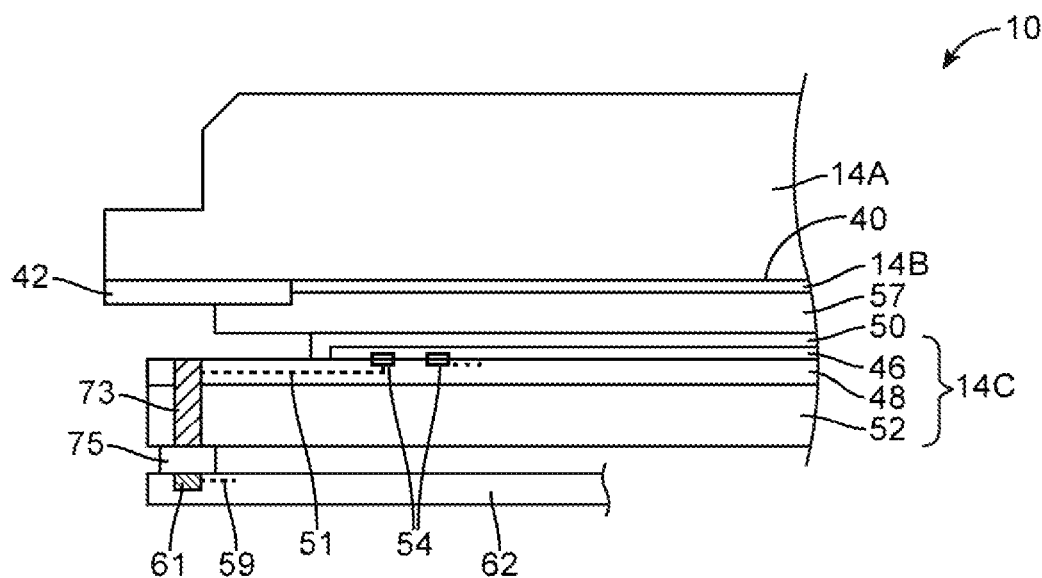
FIG. 5 is a cross-sectional view of a portion of an illustrative display having microvias that pass through multiple polymer layers in accordance with an embodiment of the present invention.

As shown in, for example, FIG. 5, display 14 may include a display cover layer such as cover layer 14A, a layer of touch-sensitive circuitry such as touch-sensor electrode layer 14B, and image-generating layers such as organic light-emitting diode display structures 14C.

Touch-sensitive layer 14B may incorporate capacitive touch electrodes. Touch-sensitive layer 14B may, in general, be configured to detect the location of one or more touches or near touches on touch-sensitive layer 14B based on capacitive, resistive, optical, acoustic, inductive, or mechanical measurements, or any phenomena that can be measured with respect to the occurrences of the one or more touches or near touches in proximity to touch sensitive layer 14B. Touch-sensitive layer 14B may be formed from touch-sensor electrodes on inner surface 40 of cover layer 14A, touch-sensor electrodes on an additional substrate attached to surface 40, or may be otherwise incorporated into display 14.

Cover layer 14A may be formed from plastic or glass (sometimes referred to as display cover glass) and may be flexible or rigid. If desired, interior surface 40 of peripheral portions of cover layer 14A (e.g., in inactive area IA) may be provided with an opaque masking layer on such as black masking layer 42. Opaque masking layer 42 may be formed from black ink, metal, or other opaque materials. Cover layer 14A may be provided with one or more notches 44. Notch 44 may be configured to fit into a portion of housing 12 such as a sidewall portion.

As shown in FIG. 5, organic light-emitting diode structures 14C may include multiple layers such as a layer of organic emissive material 46, polymer layer 48 having thin-film transistor electrodes 54, encapsulation layer 50, and a protective carrier layer such as backfilm layer 52. Organic emissive material 46 may be formed over electrodes 54 on polymer layer 48. Encapsulation layer 50 may be formed over emissive material 46 thereby encapsulating the emissive material.

Organic light-emitting diode structures 14C may be attached to cover layer 14A using adhesive such as optically clear adhesive (OCA) 57.

Organic emissive material 46 may be formed from organic plastics such as polyfluorene or other organic emissive materials. Encapsulation layer 50 may be formed from a layer of metal foil, metal foil covered with plastic, other metal structures, a glass layer, a thin-film encapsulation layer formed from a material such as silicon nitride, a layered stack of alternating polymer and ceramic materials, or other suitable material for encapsulating organic emissive material 46. Encapsulation layer 50 protects organic emissive material 46 from environmental exposure by preventing water and oxygen from reaching organic emissive materials within display 14.

Polymer layers 48 and 52 may each be formed from a thin plastic film formed from polyimide, polyethylene naphthalate (PEN), polyethylene terephthalate (PET), other suitable polymers, a combination of these polymers, etc. Other suitable substrates that may be used to form layer 48 include glass, metal foil covered with a dielectric, a multi-layer polymer stack, a thin glass film bonded to a thin polymer, a polymer composite film comprising a polymer material combined with nanoparticles or microparticles dispersed therein, etc. In one suitable arrangement that is sometimes described herein as an example, layer 48 is formed from a layer of polyimide and backfilm layer 52 is formed from polyethylene terephthalate. Polyimide layer 48 may have a thickness of 10-25 microns, 15-40 microns, 15-20 microns, or more than 5 microns. Backfilm layer 52 may have a thickness of 100-125 microns, 50-150 microns, 75-200 microns, less than 150 microns, or more than 100 microns. In one particular example, layer 48 may be 15-25 microns thick and backfilm layer 52 may be 100-125 microns thick.

Inactive area IA of display 14 may be minimized using conductive structures that route display signals through or around an edge of display 14 to circuitry (e.g., a flexible printed circuit, a rigid printed circuit, an integrated circuit) that is mounted behind the display.

As shown in FIG. 5, display 14 may be provided with one or more microvias 73 that pass through polyimide layer 48 and backfilm layer 52. Microvia 73 may be connected between signal paths such as conductive traces 51 on (or embedded within) polyimide layer 48 and signal paths such as conductive traces 59 in flexible printed circuit 62. Conductive traces 59 may be coupled to conductive contacts 61 on flexible printed circuit 62.

Microvias such as microvia 73 may be formed in layers 14C by drilling (e.g., mechanical drilling or laser drilling) an opening that passes through polyimide layer 48 and backfilm layer 52 and lining or filling the opening with conductive material. Conductive material in microvia 73 may be used to electrically couple signal lines in layer 48 (e.g., signal lines coupled to electrodes 54) to contacts 61 on flexible printed circuit 62 through microvia 73. Additional conductive material 75 (e.g., solder or anisotropic conductive adhesive) may be interposed between conductive material of microvia 73 and conductive contacts 61 on flexible printed circuit 62, if desired.

Figure 6:
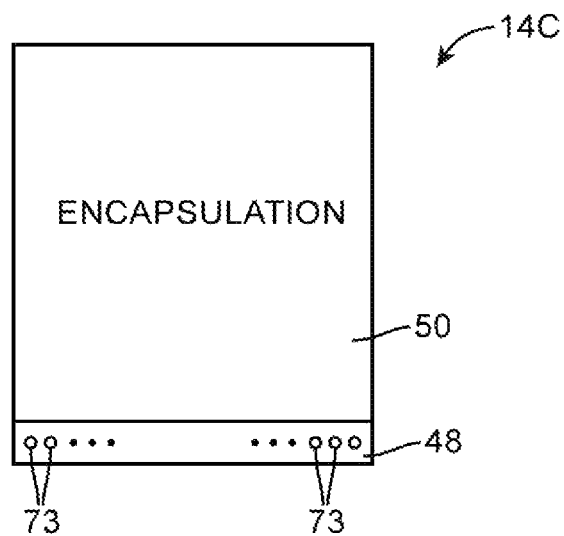
FIG. 6 is a top view of an illustrative display having microvias that pass through multiple polymer layers in accordance with an embodiment of the present invention.

As shown in the top view of organic light-emitting diode structures 14C of FIG. 6, structures 14C may include multiple microvias 73 formed on a portion of polyimide layer 48 that extends beyond an edge of encapsulation layer 50.

Figure 7:
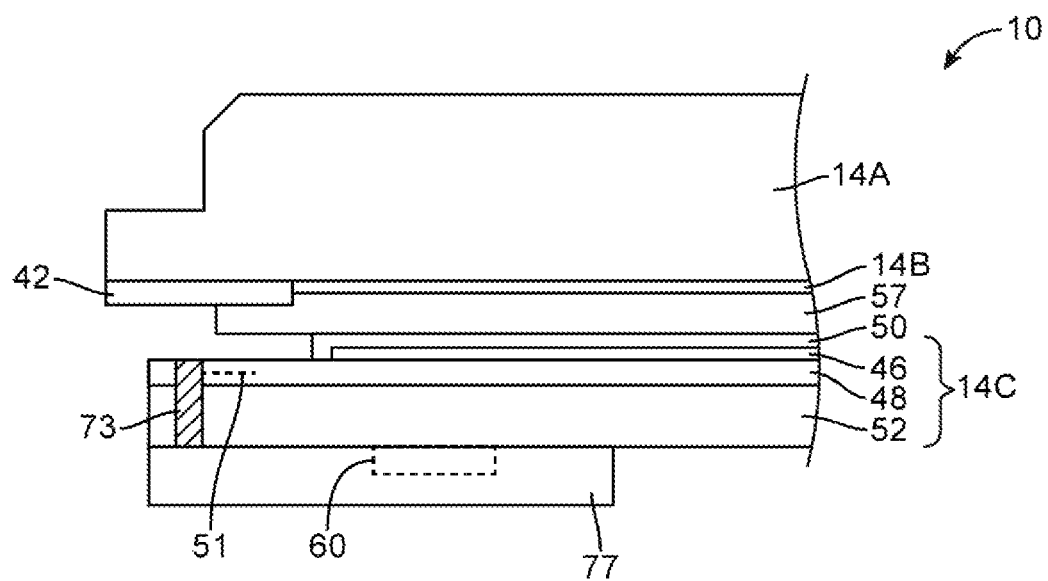
FIG. 7 is a cross-sectional view of a portion of an illustrative display having microvias coupled to an integrated circuit that is attached to an interior surface of the display in accordance with an embodiment of the present invention.

If desired, microvias 73 may be used to couple traces 51 in layer 48 directly to conductive contacts on a pre-formed combination circuit such as circuit package 77 as shown in FIG. 7. Circuit package 77 may be an integrated circuit, a printed circuit board, a printed circuit board with an embedded integrated circuit or other pre-formed circuitry. Circuit 77 may be laminated to an interior surface of layers 14C. Display driver integrated circuit may be embedded within circuit 77. Circuit 77 may include additional circuitry such as one or more layers of printed circuit material, conductive signal lines, vias, etc.

Figure 8:
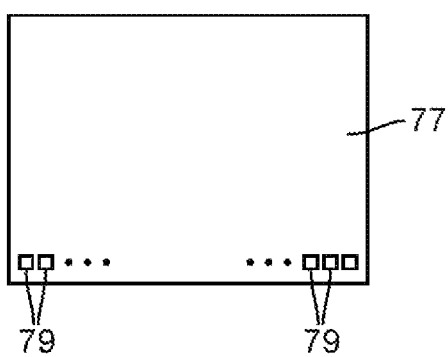
FIG. 8 is a top view of an illustrative integrated circuit that may be attached to the interior surface of the display in accordance with an embodiment of the present invention.

As shown in the top view of circuit 77 in FIG. 8, circuit 77 may include multiple conductive contacts 79 on a top surface of circuit 77. Conductive contacts 79 may be aligned with and electrically coupled to conductive material in microvias 73.

Figure 9:
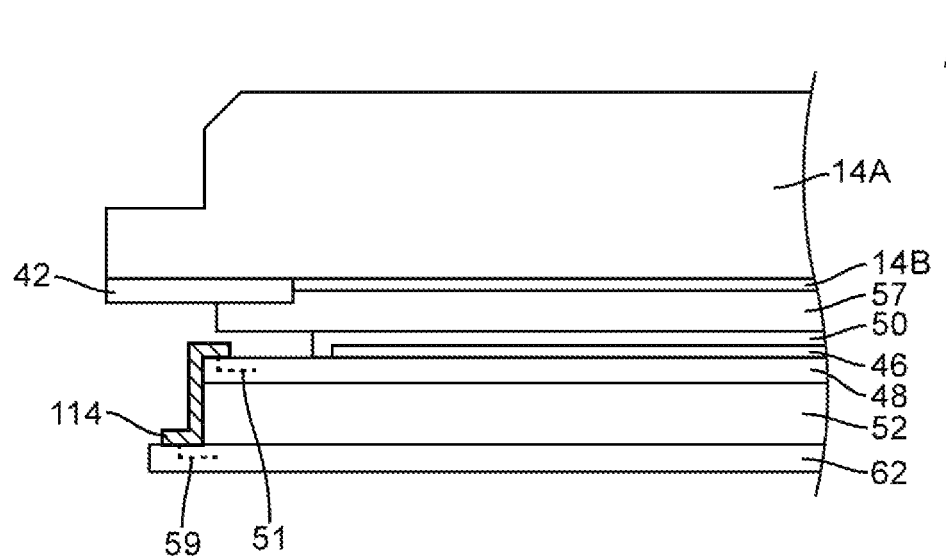
FIG. 9 is a cross-sectional view of a portion of an illustrative display having conductive structures that couple traces on a top surface of a polymer layer of the display to traces on a top surface of a flexible printed circuit in accordance with an embodiment of the present invention.

As shown in FIG. 9, device 10 may include conductive structures 114 that couple traces 51 on a top surface of layer 48 to traces 59 on a top surface of flexible printed circuit 62. Conductive structures 114 may be formed from wire bonds, wedge bonds, jetted solder paste, printed conductive material, slit coated conductive material or other conductive material. Conductive structures 114 may include a portion in contact with contact pads on a top surface of layer 48, a portion in contact with contact pads on a top surface of printed circuit 62, and, if desired, a portion formed in contact with an edge of polyimide layer 48 and backfilm layer 52.

Figure 10:
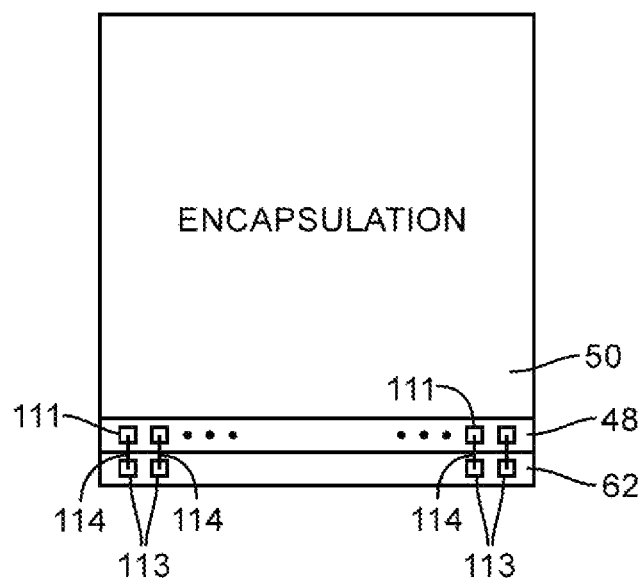
FIG. 10 is a top view of an illustrative display having conductive structures that couple traces on a top surface of a polymer layer of the display to traces on a top surface of a flexible printed circuit in accordance with an embodiment of the present invention.

As shown in the top view of FIG. 10, contact pads 11 may be formed on a portion of polyimide layer 48 that extends beyond an edge of encapsulation layer 50. Contact pads 113 may be formed on a portion of flexible printed circuit 62 that extends beyond polyimide layer 48 and backfilm layer 52. Each conductive structure 114 may be formed in contact with a selected one of contact pads 111 and a corresponding one of contact pads 113. If desired, potting material such as insulating encapsulant material may be formed over structures 114.

Figure 11:
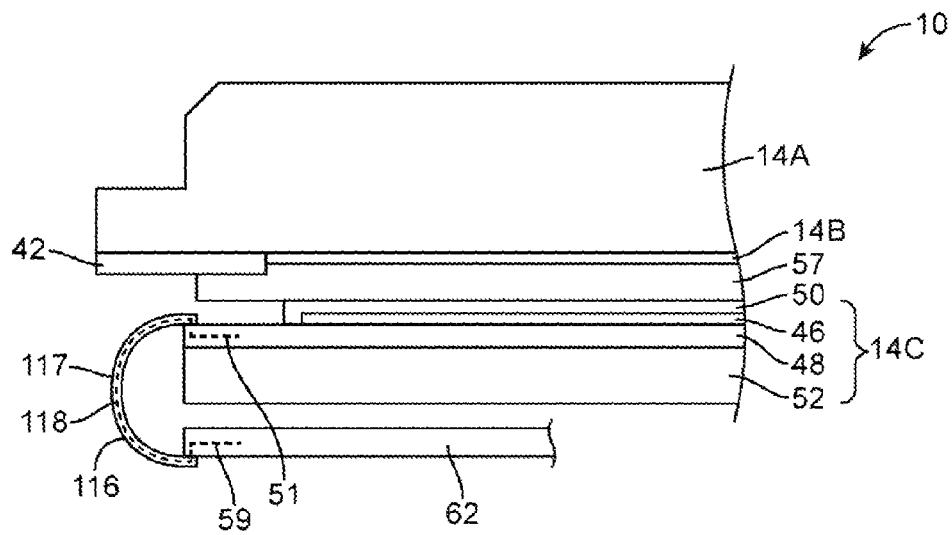
FIG. 11 is a cross-sectional view of a portion of an illustrative display having a heat seal interconnect structure that couples traces on a top surface of a polymer layer of the display to traces on a bottom surface of a flexible printed circuit in accordance with an embodiment of the present invention.

As shown in FIG. 11, device 10 may include a heat seal structure 116 that couples traces 51 on a top surface of layer 48 to traces 59 on a bottom surface of flexible printed circuit 62. Heat seal 116 may be formed from insulating material 117 (e.g., flexible polymer material, flexible adhesive material) with conductive material 118 formed on a surface of material 117 or partially or completely embedded within material 117. Heat seal 116 may include a portion in contact with contact pads on a top surface of layer 48, a portion in contact with contact pads on a bottom surface of printed circuit 62, and a portion that wraps around an edge of polyimide layer 48 and backfilm layer 52. Heat seal structure 116 may include flexible conductive materials that are resistant to cracking or breaking when bent. Conductive material 118 may be spaced with a pitch of less than 50 microns, less than 30 microns, 10-30 microns, or 20-30 microns (as examples).

Figure 12:
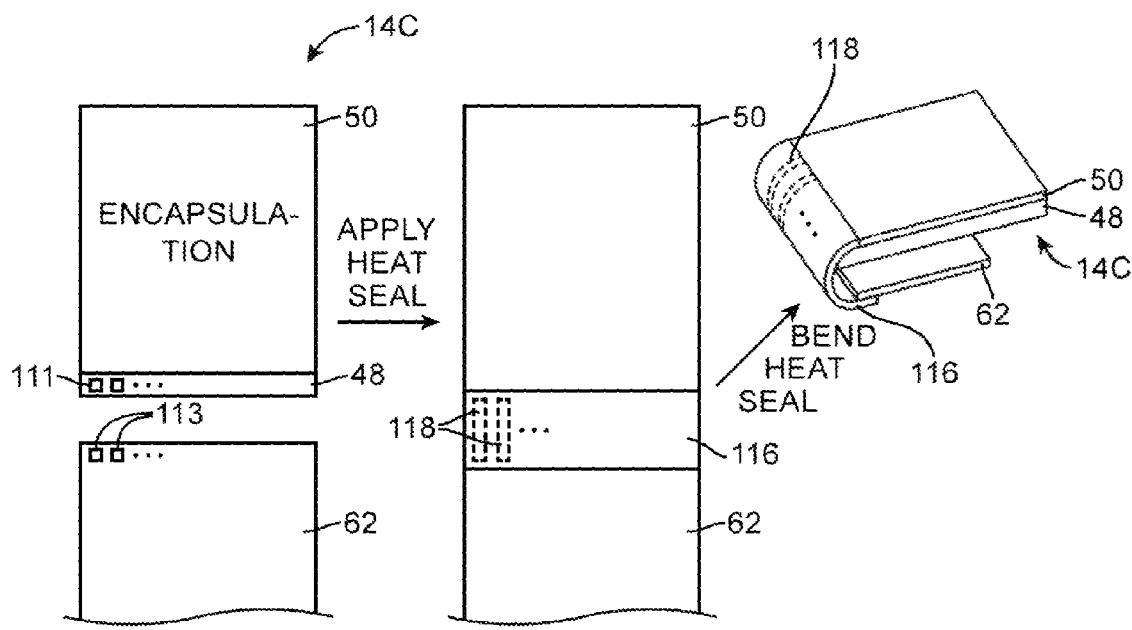
FIG. 12 is an illustrative diagram showing how a heat seal interconnect structure may be attached a top surface of a polymer layer of the display and a bottom surface of a flexible printed circuit during device assembly operations in accordance with an embodiment of the present invention.

As shown in FIG. 12, heat seal structure 116 may be coupled between layers 14C and flexible printed circuit 62 by aligning contact pads 111 on layer 48 with contact pads 113 on flexible printed circuit 62, applying the heat seal structure to layer 48 and circuit 62 so that conductive material 118 couples pads 111 to pads 113, and bending the heat seal structure to form a display assembly of the type shown in FIG. 11.

Figure 13:
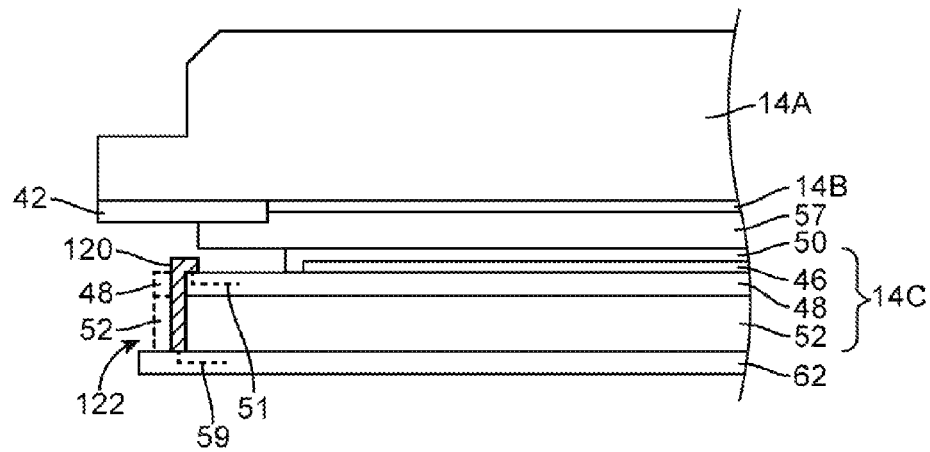
FIG. 13 is a cross-sectional view of a portion of an illustrative display having conductive structures that are formed at least partially in notches in a polymer layer of the display in accordance with an embodiment of the present invention.

As shown in FIG. 13, device 10 may include conductive structures 120 that couple traces 51 on a top surface of layer 48 to traces 59 on a top surface of flexible printed circuit 62 and that are formed at least partially in a notch such as notch 122 in polyimide layer 48 and backfilm layer 52. Conductive structures 120 may be formed from solder or any other suitable conductive material (e.g., copper). Each conductive structure 120 may include a portion in contact with contact pads on a top surface of layer 48, a portion in contact with contact pads on a top surface of printed circuit 62, and a portion within a corresponding notch 122.

Figure 14:
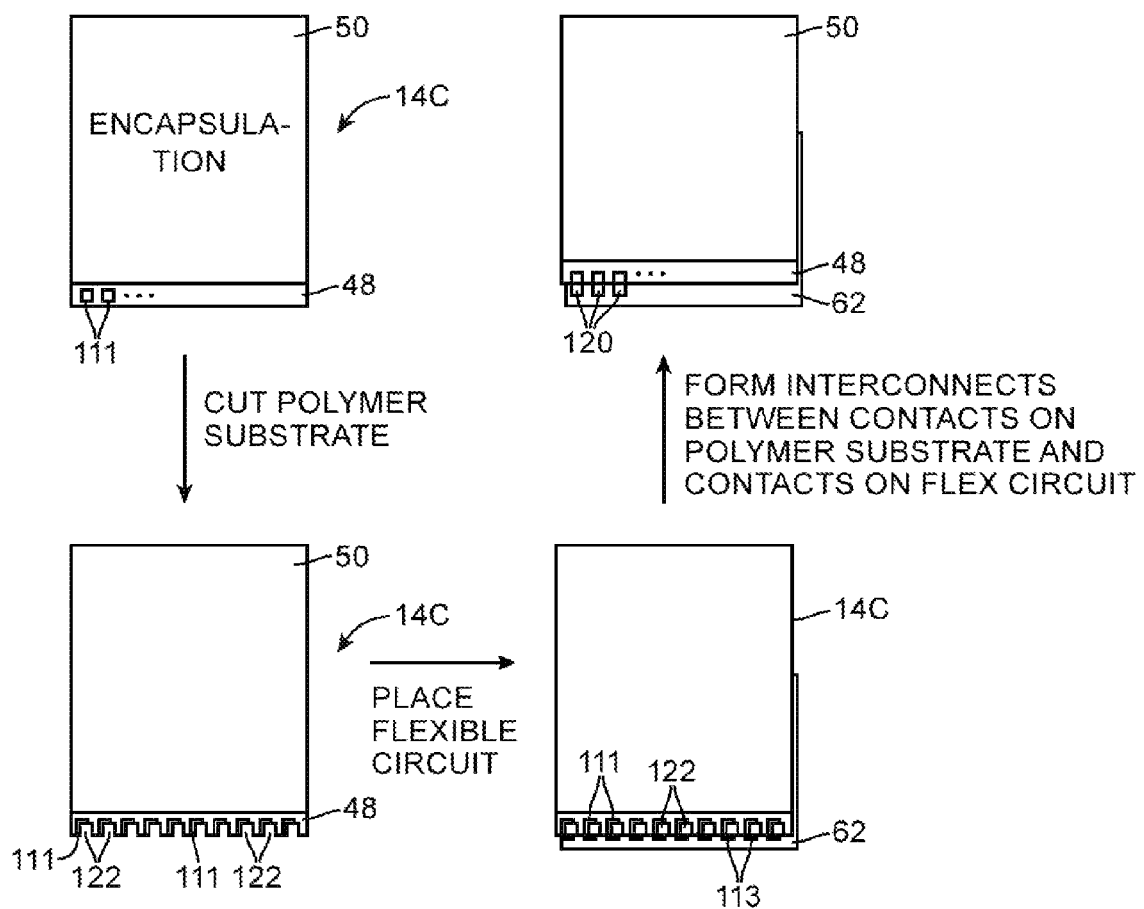
FIG. 14 is an illustrative diagram showing how conductive structures may be formed at least partially in notches in a polymer layer of the display during display assembly operations in accordance with an embodiment of the present invention.

As shown in FIG. 14, conductive structures 120 may be formed in notches that pass through layer 48 and layer 52 by cutting notches in a portion of layer 48 and layer 52 (not shown) that extends beyond an edge of encapsulation layer 50 so that the notches are adjacent to contact pads 111. A printed circuit such as flexible printed circuit 62 may then be placed against layers 14C so that at least a portion of each contact pad 113 on circuit 62 is formed adjacent to a corresponding notch in layers 48 and 52.

Conductive material 120 (e.g., solder, metal, etc.) may then be formed over contact pads 111 and in notches 122 so that the conductive material contacts contact pads 113 on flexible printed circuit 62. In this way, conductive traces 51 on a top surface of layer 48 may be electrically coupled to conductive traces on a top surface of flexible printed circuit 62.

Figure 15:
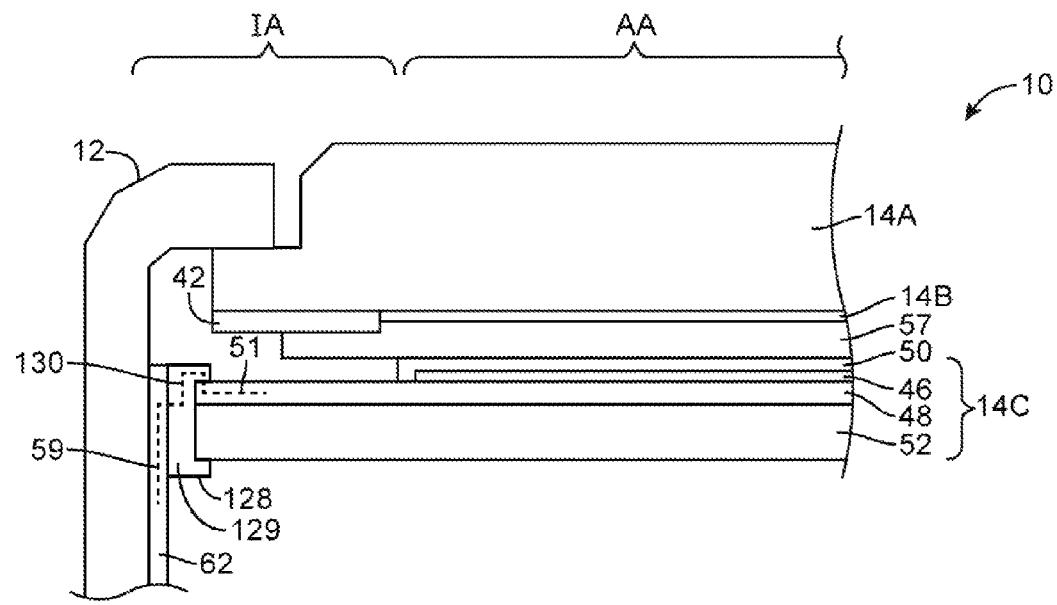
FIG. 15 is a cross-sectional view of a portion of an illustrative electronic device having polymer layers with an end that is mounted in an electrical connector member in accordance with an embodiment of the present invention.

As shown in FIG. 15, device 10 may be provided with a connector structure such as electrical connector 128. Connector 128 may, for example, be a Zip connector. Connector 128 may have a plastic portion 129 that at least partially wraps around an edge of polyimide layer 48 and backfilm layer 52. Connector 128 may include conductive structures such as conductive pins 130 that couple traces 51 on layer 48 to traces 59 in flexible printed circuit 62. In this type of configuration, a portion of flexible printed circuit 62 may be attached to a portion of housing 12 of device 10. In this way, the size of inactive area IA of display 14 may be minimized by mating display 14 to a sidewall member of housing 12.

Figure 16:
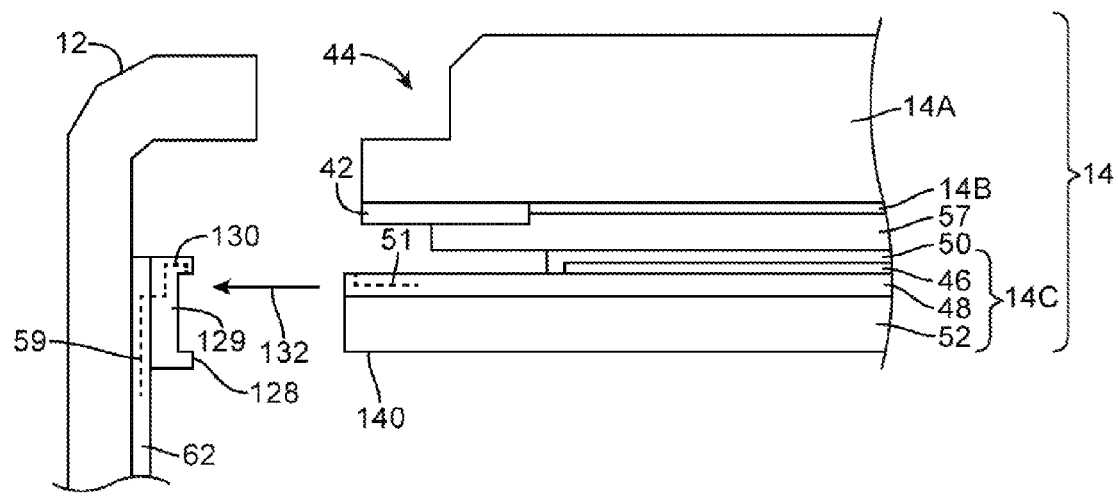
FIG. 16 is an illustrative diagram showing how and end portion of polymer layers of a display may be inserted into an electrical connector member that is attached to a housing structure during device assembly operations in accordance with an embodiment of the present invention.

As shown in FIG. 16, during device assembly operations, display 14 may be moved toward housing member 12 in direction 132 so that edge portion 140 of layers 48 and 52 are inserted into connector 128. When edge portion 140 is inserted into connector 128, notch 44 in cover layer 14A may mate with a top portion of housing 12 and traces 51 of layer 48 may be electrically coupled to conductive structures 130 of connector 128.

Figure 17:
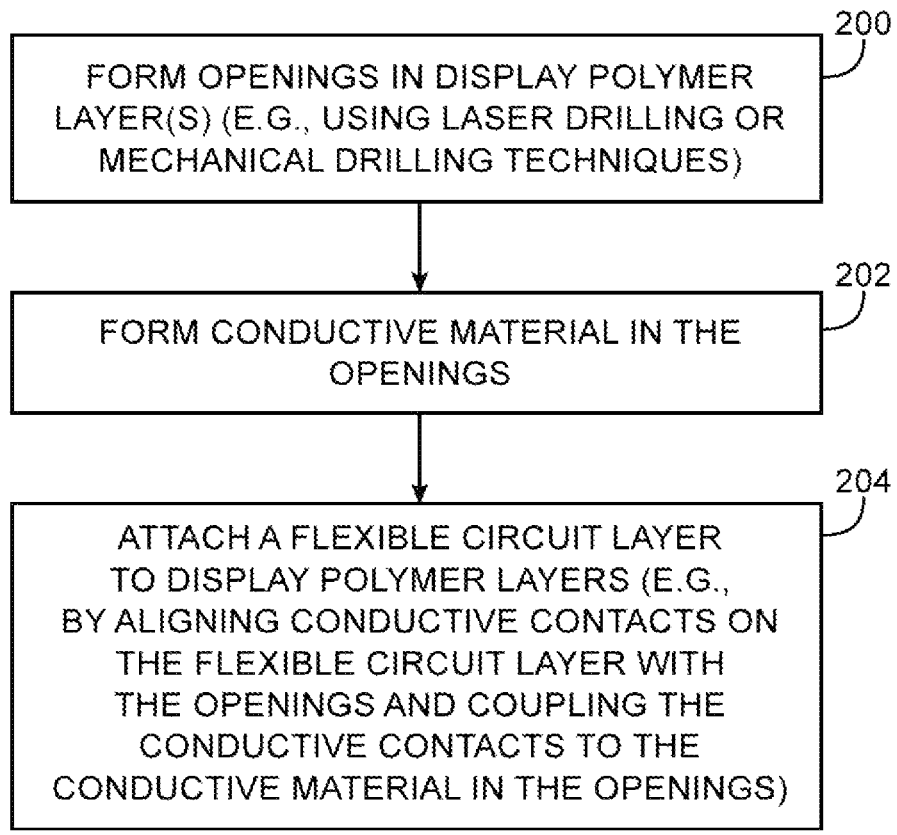
FIG. 17 is a flow chart of illustrative steps that may be used in forming a display with microvias that pass through polymer layers of the display in accordance with an embodiment of the present invention.

Illustrative steps that may be used in forming organic light-emitting diode displays of the type shown in FIG. 5 are shown in FIG. 17.

At step 200 openings may be formed in one or more polymer layers of a display (e.g., polymer layers 48 and/or 52 of display 14). Forming the openings in the polymer layers may include laser drilling, mechanically drilling, or otherwise forming the openings in the polymer layers.

At step 202, conductive material (e.g., solder, solder paste, metal such as copper, nickel, or other metal) may be formed in the openings.

At step 204, a flexible circuit layer such as flexible printed circuit 62 of FIG. 5 may be attached to the display polymer layers (e.g., to layer 52). Attaching the flexible circuit layer may include aligning conductive contacts on the flexible circuit layer with the openings and coupling the conductive material in the openings to conductive contacts on the flexible printed circuit. If desired, coupling the conductive material in the openings to the conductive contacts on the flexible printed circuit may include coupling the conductive material directly to the conductive contacts or additional conductive material (e.g., material 75 of FIG. 5) may be used to couple the conductive material in the openings to the conductive contacts on the flexible circuit layer.

Figure 18:
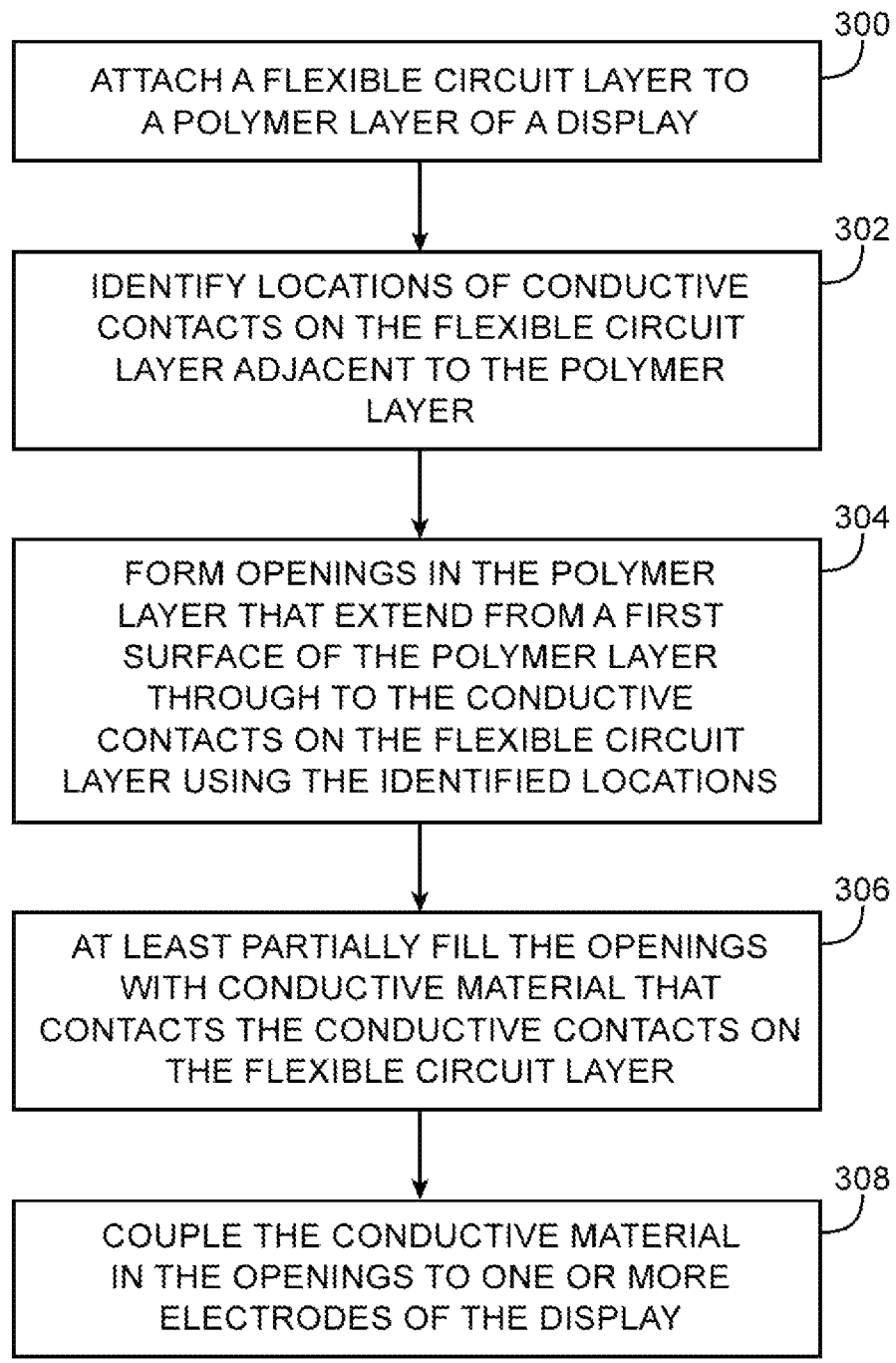
FIG. 18 is a flow chart of illustrative steps that may be used in forming a display with microvias that pass through polymer layers of the display by forming the microvias while a flexible circuit layer is attached to the polymer layers in accordance with an embodiment of the present invention.

However, the steps of FIG. 17 are merely illustrative. If desired, the flexible circuit layer may be attached to the display polymer layers prior to forming microvias in the display polymer layers. Illustrative steps that may be used in forming microvias in display polymer layers with a flexible circuit layer attached are shown in FIG. 18.

At step 300, a flexible circuit layer such as layer 62 of FIG. 5 may be attached to a display polymer layer such as polymer layer 52 of display 14. The flexible circuit layer may be attached to the polymer layer so that conductive contacts on the flexible circuit layer are adjacent to the polymer layer.

At step 302, locations of the conductive contacts (e.g., contacts 61) on the flexible circuit may be identified.

At step 304, openings may be formed (e.g., using laser drilling, mechanical drilling, or other techniques for forming openings) in the polymer layer that extend from a first surface of the polymer layer through to the conductive contacts on the flexible circuit layer. The identified locations of the conductive contacts may be used to form the openings over the conductive contacts. If desired, forming openings in the polymer layer may include forming openings in other polymer layer such as layer 48 of display 14.

At step 306, the openings in the polymer layer may be at least partially filled with conductive material (e.g., solder, solder paste, metal such as copper, nickel, or other metal) that contacts the conductive contacts on the flexible circuit layer.

At step 308, the conductive material in the openings may be coupled to one or more electrodes (e.g., electrodes 54) of the display. Coupling the conductive material to the electrodes may include coupling the conductive material to traces such as traces 51 of FIG. 5 or may include other coupling procedures such as wire bonding, solder printing, or other suitable procedures for electrically coupling the conductive material to the electrodes.

The foregoing is merely illustrative of the principles of this invention and various modifications can be made by those skilled in the art without departing from the scope and spirit of the invention.

What is claimed is:

1. An electronic device, comprising:
   a display that includes:
   a first polymer layer,
   a layer of organic emissive material on the first polymer layer,
   an encapsulation layer formed over the layer of organic emissive material,
   a second polymer layer attached to the first polymer layer, and
   at least one microvia that passes through the first polymer layer and the second polymer layer, wherein the at least one microvia is located in a portion of the first polymer layer that is uncovered by the encapsulation layer; and
   additional circuitry coupled to the at least one microvia.

2. The electronic device defined in claim 1 wherein the additional circuitry comprises a flexible printed circuit and wherein the at least one microvia couples conductive traces on the first polymer layer to conductive traces in the flexible printed circuit.

3. The electronic device defined in claim 2, further comprising:
   solder that connects the at least one microvia to the conductive traces in the flexible printed circuit.

4. The electronic device defined in claim 2, further comprising:
   anisotropic conductive adhesive that connects the at least one microvia to the conductive traces in the flexible printed circuit.

5. The electronic device defined in claim 1 wherein the additional circuitry comprises an embedded display driver integrated circuit.

6. An electronic device, comprising:
   a display that includes:
   a first polymer layer having conductive traces,
   a layer of organic emissive material on the first polymer layer, and
   a second polymer layer attached to the first polymer layer;
   a printed circuit having conductive traces; and
   conductive connector structures that couple the conductive traces on the first polymer layer to the conductive traces of the printed circuit, wherein the conductive connector structures extend around an edge of the first and second polymer layers.

7. The electronic device defined in claim 6 wherein the first polymer layer comprises polyimide and wherein the second polymer layer comprises polyethylene terephthalate.

8. The electronic device defined in claim 6 wherein the conductive connector structures comprise jetted solder paste that couples the conductive traces on the first polymer layer to the conductive traces of the flexible printed circuit.

9. The electronic device defined in claim 6 wherein the conductive connector structures comprise at least a portion formed on the edge of the first and second polymer layers.

10. The electronic device defined in claim 6, further comprising a heat seal structure having a first end attached to the first polymer layer and a second opposing end attached to the printed circuit, wherein the conductive connector structures comprise conductive material in the heat seal structure.

11. An electronic device, comprising:
    a display, comprising:
    first and second polymer layers,
    conductive contact pads on the first polymer layer, and
    a plurality of notches in the first and second polymer layers, wherein each of the notches is adjacent to a corresponding one of the conductive contact pads;
    a printed circuit having conductive contact pads; and
    conductive material that couples the conductive contact pads on the first polymer layer to the conductive contact pads on the printed circuit, wherein at least some of the conductive material is formed within each of the plurality of notches.

12. The electronic device defined in claim 11 wherein the display further comprises a layer of organic emissive material and an encapsulation layer over the layer of organic emissive material.

13. The electronic device defined in claim 12 wherein the conductive contact pads on the first polymer layer are formed on a portion of the first polymer layer that extends beyond an edge of the encapsulation layer.

14. The electronic device defined in claim 11 wherein the printed circuit comprises a flexible printed circuit.

15. The electronic device defined in claim 14 wherein at least a portion of each conductive contact pad on the printed circuit is located adjacent to a corresponding one of the plurality of notches.

16. An electronic device, comprising:
    a display having a layer of organic light-emitting material, a first polymer layer having conductive traces, and a second polymer layer;
    a flexible printed circuit; and
    an electrical connector attached to the flexible printed circuit, wherein the electrical connector receives an end of the first polymer layer and the second polymer layer.

17. The electronic device defined in claim 16, further comprising a housing.

18. The electronic device defined in claim 17 wherein the flexible printed circuit is attached to a sidewall portion of the housing.

19. The electronic device defined in claim 18 wherein the display includes a transparent cover layer having a notch and wherein the housing sidewall portion includes a portion that mates with the notch.

20. The electronic device defined in claim 18 further comprising:
    conductive traces in the flexible printed circuit that are coupled to the conductive traces of the first polymer layer through the electrical connector.

* * * * *